(12) United States Patent
Thomson, Jr. et al.

(10) Patent No.: US 10,426,042 B2
(45) Date of Patent: Sep. 24, 2019

(54) BACK-DRILLED THROUGH-HOLE PRINTED CIRCUIT BOARD (PCB) SYSTEMS

(71) Applicant: DISH Technologies L.L.C., Englewood, CO (US)

(72) Inventors: Andros X Thomson, Jr., Parker, CO (US); Yt Ho, Kaohsiung (TW)

(73) Assignee: DISH Technologies L.L.C., Englewood, CO (US)

( * ) Notice: Subject to any disclaimer, the term of this patent is extended or adjusted under 35 U.S.C. 154(b) by 0 days.

(21) Appl. No.: 15/905,063

(22) Filed: Feb. 26, 2018

(65) Prior Publication Data

US 2018/0192523 A1    Jul. 5, 2018

Related U.S. Application Data

(62) Division of application No. 14/583,555, filed on Dec. 26, 2014, now Pat. No. 9,942,993.

(51) Int. Cl.
| | |
|---|---|
| *H05K 1/18* | (2006.01) |
| *H05K 3/34* | (2006.01) |
| *H05K 1/11* | (2006.01) |
| *H05K 3/00* | (2006.01) |

(52) U.S. Cl.
CPC ........... *H05K 3/3447* (2013.01); *H05K 1/115* (2013.01); *H05K 3/0047* (2013.01); *H05K 2201/09845* (2013.01); *H05K 2203/0207* (2013.01)

(58) Field of Classification Search
CPC ......... H05K 1/115; H05K 2201/09845; H05K 2203/0207; H05K 3/0047; H05K 3/3447
See application file for complete search history.

(56) References Cited

U.S. PATENT DOCUMENTS

| | | | |
|---|---|---|---|
| 5,038,252 A | * | 8/1991 | Johnson ............... H05K 1/0263 174/251 |
| 7,337,537 B1 | | 3/2008 | Smetana, Jr. |

(Continued)

OTHER PUBLICATIONS

U.S. Appl. No. 14/583,555, filed Dec. 26, 2014 Non-Final Rejection dated Apr. 24, 2017, all pages.

(Continued)

*Primary Examiner* — Yuriy Semenenko
(74) *Attorney, Agent, or Firm* — Kilpatrick Townsend & Stockton LLP

(57) ABSTRACT

An approach for through-hole component soldering for a PCB, and a resulting PCB assembly, that eliminates protruding solder joints, is provided. The approach comprises back-drilling, from a bottom surface of a PCB, one or more through-holes, wherein each back-drilled through-hole is back-drilled to a depth partially through the PCB and at a diameter that is larger than the diameter of the through hole. Solder paste is applied to the PCB. The components are placed on the PCB, inserting each pin into a corresponding through-hole. The PCB is passed through a solder process, whereby, within each through-hole having a component pin inserted therein, the solder paste is wicked into the through-hole, and forms a solder joint with the respective pin. Each solder joint of a back-drilled through-hole is situated within the through-hole in a manner whereby the solder joint does not protrude beyond the bottom surface of the PCB.

16 Claims, 6 Drawing Sheets

(56) References Cited

U.S. PATENT DOCUMENTS

| | | | |
|---|---|---|---|
| 7,621,759 B2* | 11/2009 | Ito | H05K 1/116 |
| | | | 439/79 |
| 9,258,885 B2 | 2/2016 | Huang et al. | |
| 9,668,345 B2* | 5/2017 | Yamaguchi | H05K 1/0251 |
| 9,942,993 B2 | 4/2018 | Thomson, Jr. et al. | |
| 2008/0217051 A1* | 9/2008 | Matsui | H05K 1/0269 |
| | | | 174/266 |
| 2009/0068864 A1* | 3/2009 | Honda | H01R 43/0256 |
| | | | 439/83 |
| 2009/0188710 A1 | 7/2009 | Senk | |
| 2010/0084178 A1* | 4/2010 | Sweeney | H05K 1/113 |
| | | | 174/262 |
| 2013/0213705 A1* | 8/2013 | Suehiro | H05K 3/0047 |
| | | | 174/262 |
| 2013/0327563 A1* | 12/2013 | Kitagawa | H05K 1/116 |
| | | | 174/257 |
| 2014/0283381 A1 | 9/2014 | Murata | |
| 2015/0173181 A1 | 6/2015 | Xu et al. | |
| 2015/0208514 A1 | 7/2015 | Thomas et al. | |
| 2016/0150653 A1 | 5/2016 | Chen et al. | |
| 2017/0127534 A1* | 5/2017 | Mutnury | H05K 3/42 |

OTHER PUBLICATIONS

U.S. Appl. No. 14/583,555, filed Dec. 26, 2014 Final Rejection dated Aug. 4, 2017, all pages.

* cited by examiner

BACK-DRILLED THROUGH-HOLE PRINTED CIRCUIT BOARD (PCB) SYSTEMS

CROSS-REFERENCE TO RELATED APPLICATIONS

This application is a divisional of U.S. application Ser. No. 14/583,555, filed Dec. 26, 2014, the disclosure of which is incorporated by reference herein in its entirety.

BACKGROUND

Since the second generation of computers in the 1950's, until the rise of surface-mount technology, through-hole soldering has been the predominant process for mounting integrated circuit (IC) and other electrical components on printed circuit boards. Even though surface-mount technology has largely replaced through-hole circuit board assembly, however, through-hole technology remains a significant part of electronic device manufacturing in various technology areas and for various components that are still manufactured in through-hole packaging. Through-hole technology refers to an electronic component mounting process, whereby electrical conductor leads of a component are inserted through holes drilled in the printed circuit board (PCB), and are soldered to conductor pads on the board either by manual assembly or automated insertion mount machines.

FIGS. 1A, 1B and 1C show various views of a typical through-hole PCB assembly/solder process. FIG. 1A illustrates a top view of a section of a printed circuit board (PCB) 101 with the components (an IC 110, a coil 112 and a capacitor 114) inserted into the PCB for a typical through-hole PCB component assembly/solder process. FIG. 1B illustrates a cross-sectional view of the PCB section of FIG. 1A (along the line X-X'), showing a cross-section along the through-holes of the PCB and the component pins inserted through the through-holes FIG. 1C illustrates the cross-sectional view of the PCB section of FIG. 1B, after completion of the typical through-hole PCB component solder process, along with an expanded view of a single solder joint and wiring layers of the PCB. With reference to FIG. 1B, in a typical through-hole process, the pins or electrical conductor leads of the component (e.g., the pins 116 of the IC 110, the pins 118 of the coil 112, the pins 120 of the capacitor 114) are inserted through plated holes 122 in the PCB, such that pin protrusions 124 from the component leads extend through the back side of the PCB 101. When soldered, for example, through a wave solder process, the component leads (including the pin protrusions through the back of the board) and the plated through-hole form a solder joint. During the normal process, the boards are first run through a surface-mount stencil printer that applies a solder paste over the top side of the board, forcing the solder paste into the plated through-holes of the PCB 101. After the solder paste is applied, the board is run through a component placement machine that places the surface mount (SMT) components, and then operators place the pin-in-hole (PIH) components by inserting the component leads into the respective PCB through-holes 122. The PCB 101 is then put through a solder reflow oven (or in other applications/processes, a solder wave bath), which heats the board and melts the solder paste to form a solder joint between each component lead and the metalized portion of the respective through-hole. This process leaves protruding component pins on the bottom of the printed circuit card assembly (PCBA) with a conical shaped solder joint attached to the annular ring of the metal through hole.

With reference to FIG. 1C, and the expanded view of a single solder joint as a result of the solder reflow process, ideally, the solder flows into the through-hole and fills a space between the component leads and the metalized surface of the through-hole 122. Additionally, the solder paste forms a protruding conical-shaped solder joint 128 around the pin protrusion 124. Accordingly, this protruding solder joint around the pins of the electrical component creates a point for a potential electrical short and for potential damage during further assembly of the overall product and during operation and repair thereof. For example, in the event that the circuit board comprises a daughter card that is to be mounted or soldered on a further system card or motherboard. Additionally, for example, the protruding solder joints produce points for potential electrical shorts with respect to jumper wires or other components that may be added to the board at a subsequent point. Further, in order to avoid future electrical shorts within the overall product, the protruding solder joints create constraints on the minimum distance between two adjacent boards in the overall assembly—thus creating constraints on such things as product size reduction. Alternatively, in the use of such traditional solder processes that create protruding solder joints, a separate substrate would be attached to the primary assembly to serve as an insulating layer to protect and insulate the protruding solder joints.

There is, therefore, a need for an electrical circuit board component solder/assembly process, and resulting circuit board product, that eliminates any solder protrusion points in a through-hole electrical component solder/assembly process.

SOME EXAMPLE EMBODIMENTS

Embodiments of the present invention advantageously address the needs above, as well as other needs, by providing an approach for through-hole component soldering/assembly for an electrical circuit card or printed circuit board (PCB), and a resulting circuit card or PCB assembly, that eliminates solder protrusion points or protruding solder joints resulting from the through-hole solder process.

In accordance with example embodiments of the present invention, an approach is provided, for through-hole component soldering/assembly for an electrical circuit card, wherein the component through-holes in the circuit board are partially back-drilled with a wider aperture. Then, when heated, the solder or solder paste wicks or draws back from the surface of the oversized back-drilled aperture. Consequently, at the at the back of the board, the solder joints are recessed below the surface of the back side of the PCB. Accordingly, this through-hole solder process eliminates any solder protrusions from the back of the assembled circuit card.

In accordance with example embodiments, a method comprises back-drilling, from a bottom surface of a printed circuit board (PCB), one or more component through-holes in the PCB, wherein each back-drilled through-hole is back-drilled to a depth partially through the PCB and at a diameter that is larger than the diameter of the through hole. The method further comprises applying solder paste to at least one side of the PCB. One or more components are placed on a top surface of the PCB, inserting each pin of each component into a corresponding through-hole. The PCB is passed through a solder process, whereby, within each through-hole of the PCB having a component pin inserted therein, the solder paste is wicked into the through-hole, and forms a solder joint with the respective pin. Each solder joint of a back-drilled through-hole is situated within the through-hole in a manner whereby the solder joint does not protrude beyond the bottom surface of the PCB. By way of example, each back-drilled through-hole is back-drilled to a depth of approximately 20% of the overall depth of the through-hole. By way of further example, each back-drilled through-hole is back-drilled at a diameter that is approximately 200% of the diameter of the through hole. By way of further example, the through-holes of the PCB are plated either before performing the back-drilling step or after performing the back-drilling step. By way of further example, the solder paste is applied at least to the bottom surface of the PCB, whereby the solder paste is forced into at least the back-drilled portion of each back-drilled through-hole.

In accordance with further example embodiments, an apparatus comprises a printed circuit board (PCB), and one or more components mounted on a top surface of the PCB, wherein each pin of the one or more components is secured within a respective through-hole in the PCB by a solder joint. One or more of the through-holes of the PCB that contains a component pin solder joint is back-drilled, from a bottom surface of the PCB, to a depth partially through the PCB and at a diameter that is larger than the diameter of the through hole. Further, each solder joint of a back-drilled through-hole is situated within the through-hole in a manner whereby the solder joint does not protrude beyond the bottom surface of the PCB. By way of example, the back-drilled portion of each back-drilled through-hole is of a depth of approximately 20% of the overall depth of the through-hole. By way of further example, the back-drilled portion of each back-drilled through-hole is of a diameter that is approximately 200% of the diameter of the through hole. By way of further example, plating within each back-drilled through-hole either does not extend into the back-drilled portion of the through-hole or extends into the back-drilled portion of the through-hole.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawings and description are to be regarded as illustrative in nature, and not as restrictive.

BRIEF DESCRIPTION OF THE DRAWINGS

Embodiments of the present invention are illustrated by way of example, and not by way of limitation, in the figures of the accompanying drawings, wherein like reference numerals refer to similar elements and wherein.

DETAILED DESCRIPTION

An approach for through-hole component soldering/assembly for an electrical circuit card or printed circuit board (PCB), and a resulting circuit card or PCB assembly, that eliminates solder protrusion points or protruding solder joints resulting from the through-hole solder process, is described. In the following description, for the purposes of explanation, numerous specific details are set forth in order to provide a thorough understanding of the present invention. The present invention is not intended to be limited based on the described embodiments, and various modifications will be readily apparent. It will be apparent that the invention may be practiced without the specific details of the following description and/or with equivalent arrangements. Additionally, well-known structures and devices may be shown in block diagram form in order to avoid unnecessarily obscuring the invention. Further, the specific applications discussed herein are provided only as representative examples, and the principles described herein may be applied to other embodiments and applications without departing from the general scope of the present invention.

Figure 1A:
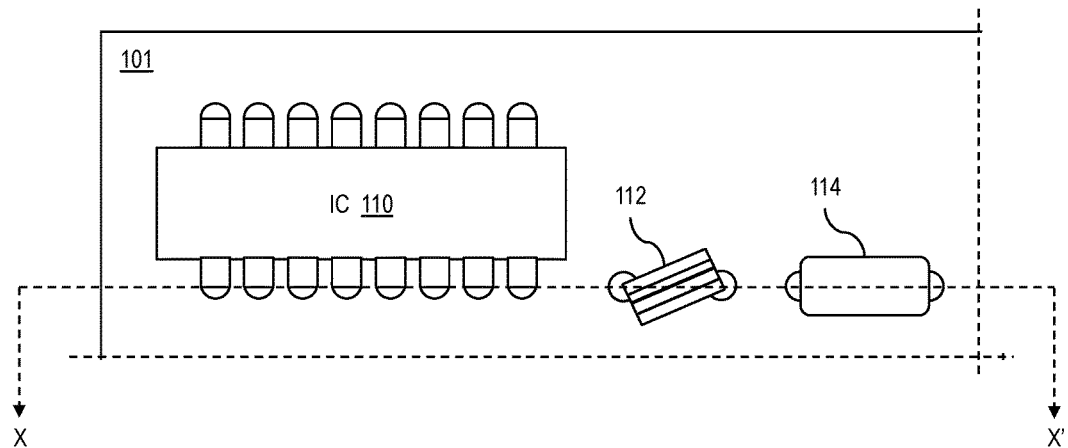
FIG. 1A illustrates a top view of a section of a printed circuit board (PCB) with the components inserted into the PCB for a typical through-hole PCB component assembly/solder process.
Figure 1B:
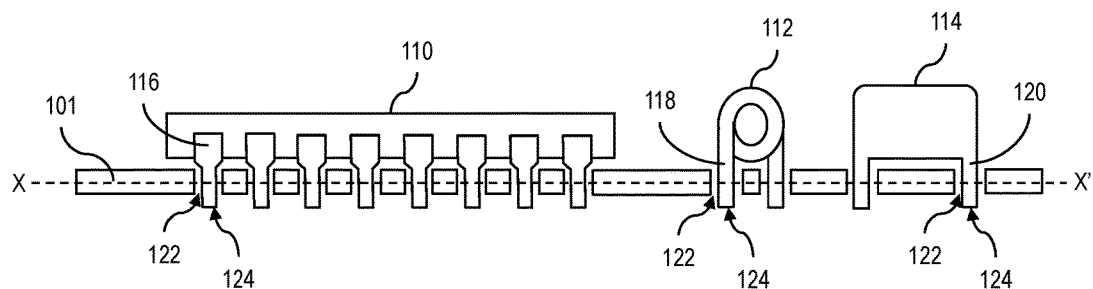
FIG. 1B illustrates a cross-sectional view of the PCB section of FIG. 1A (along the line X-X'), showing a cross-section along the through-holes of the PCB and the component pins inserted through the through-holes.
Figure 1C:
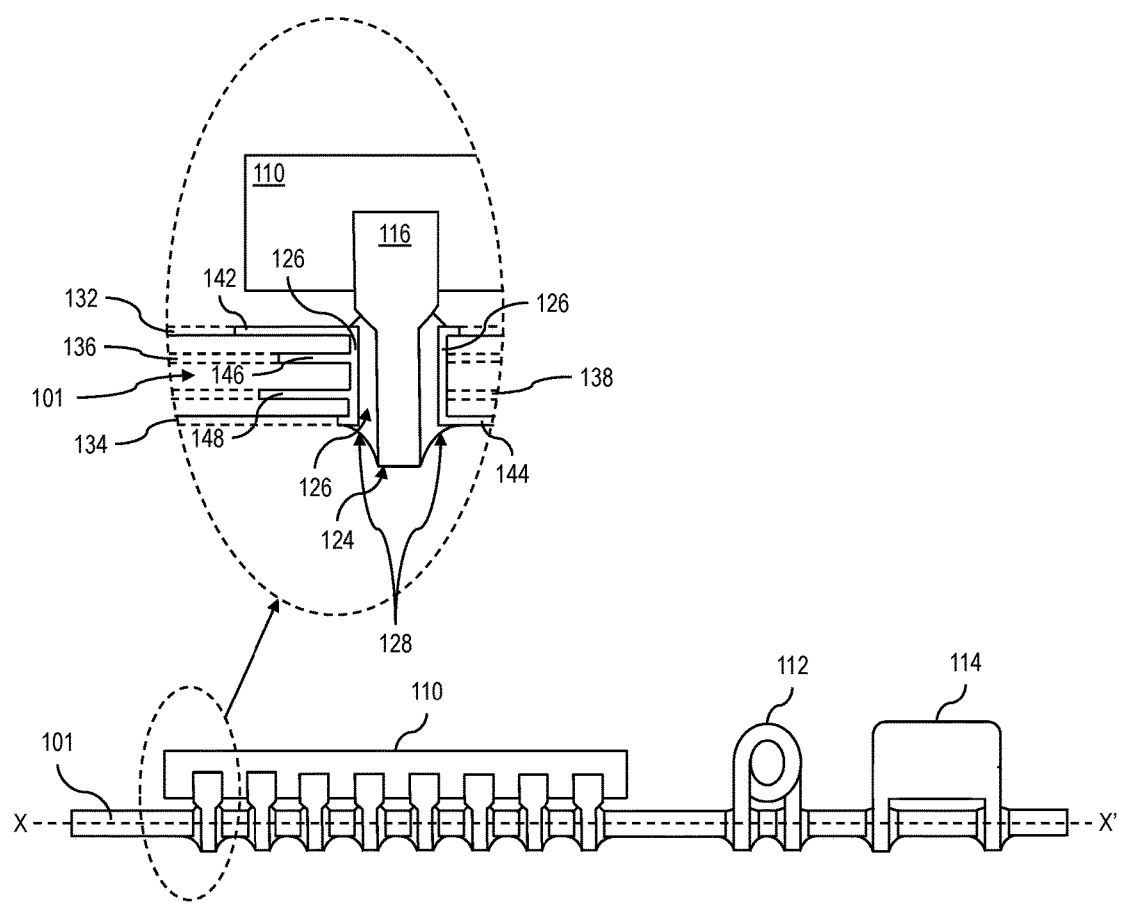
FIG. 1C illustrates the cross-sectional view of the PCB section of FIG. 1B, after completion of the typical through-hole PCB component solder process, along with an expanded view of a single solder joint and wiring layers of the PCB.

A typical multilayer printed circuit board (PCB) 101 includes a plurality of wiring layers within the layers of the PCB. With reference to the expanded view of the one solder joint illustrated in FIG. 1C, example wiring layers of the PCB are also depicted. For example, wiring layers 132 and 134 run on the top and bottom of the PCB, respectively, and wiring layers 136 and 138 run within layers sandwiched inside the PCB. In the example of FIG. 1C, the depicted wires, 142 within the top layer 132, 144 within the bottom layer 134 and 146 and 148 respectively within the middle layers 136 and 138, each connects to the pin 116 of the IC 110 via the plating 126 within the through-hole and the solder joint 122.

Figure 2A:
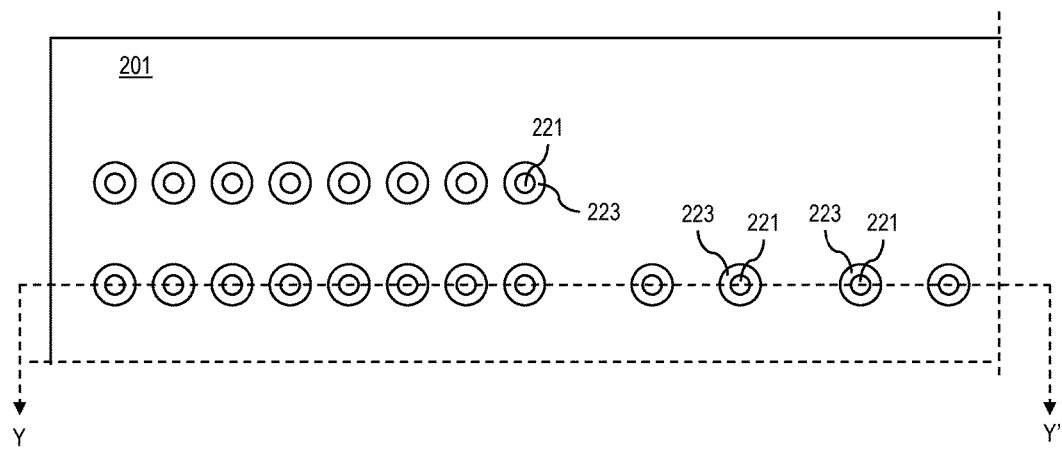
FIG. 2A illustrates a bottom view of a section of a printed circuit board (PCB) with back-drilled through-holes, in accordance with example embodiments of the present invention.
Figure 2B:
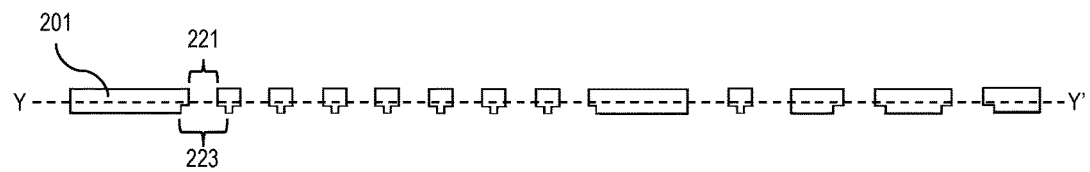
FIG. 2B illustrates a cross-sectional view of the PCB section of FIG. 2A (along the line Y-Y'), showing a cross-section along the through-holes of the PCB, in accordance with example embodiments of the present invention.

FIG. 2A illustrates a bottom view of a section of a printed circuit board (PCB) 201 with back-drilled through-holes 221/223, in accordance with example embodiments of the present invention. As depicted in FIG. 2A, the back of each through-hole 221 is partially drilled at a larger diameter than the diameter of the through-hole, resulting in a partially back-drilled portion 223 of the rough-hole. The back-drilled hole 223 is drilled only a portion of the way through the PCB. By way of example, the back drilled aperture 223 is drilled to a depth that is approximately 20% of the total depth of the through-hole (20% of the thickness of the PCB), and at a diameter that is approximately 200% of the overall diameter, of the through-hole 221. For an alternate view, FIG. 2B illustrates a cross-sectional view of the PCB section 201 of FIG. 2A (along the line Y-Y'), showing a cross-section along the through-holes of the PCB, in accordance with example embodiments of the present invention. As depicted, the cross-sectional view of FIG. 2B illustrates a side view of the through-hole 221, and the back-drilled hole 223, drilled at a relatively larger diameter (e.g., 2×) than the diameter of the through-hole 221, and drilled only partially through the PCB 201 (e.g., approximately $\frac{1}{5}^{th}$ of the total depth). In accordance with one embodiment, the back-drilled portion 223 of the through-hole is drilled after the plating process, whereby the back-drilling removes the plating from the back-drilled portion 223 of the through-hole (as depicted in the expanded view (i) of FIG. 2C). In accordance with an alternative embodiment, the back-drilled portion 223 of the through-hole is drilled prior to the plating process, whereby the plating is added to both the through-hole 221 and the back-drilled portion 223 thereof (as depicted in the expanded view (ii) of FIG. 2C).

Figure 2C:
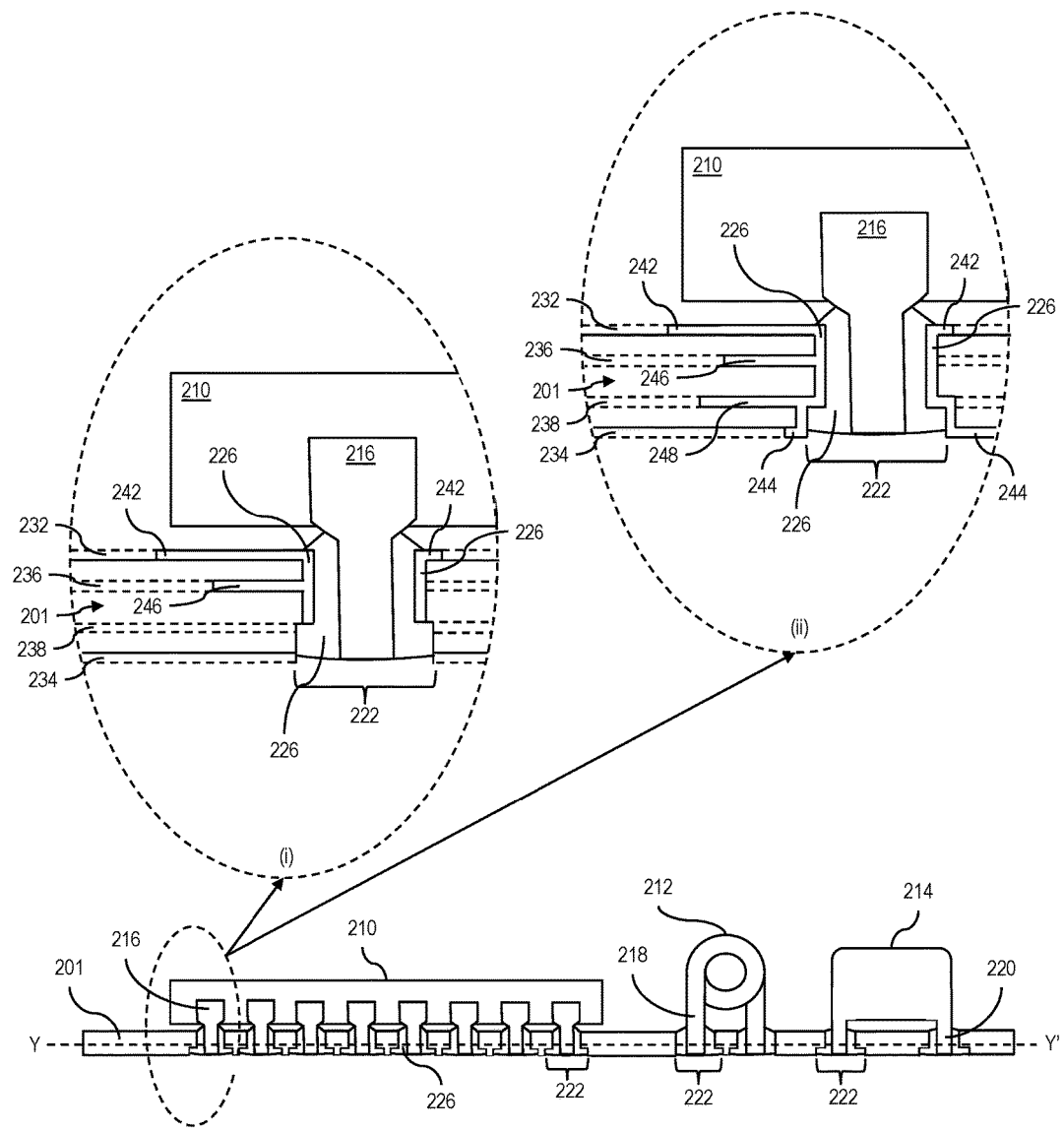
FIG. 2C illustrates the cross-sectional view of the PCB section of FIG. 2B, after completion of a through-hole PCB component solder process, along with two expanded views (i) and (ii) of a single solder joint, in accordance with example embodiments of the present invention.

FIG. 2C illustrates the cross-sectional view of the PCB section 201 of FIG. 2B, after completion of a through-hole PCB component solder process, along with two expanded views (i) and (ii) of a single solder joint, in accordance with example embodiments of the present invention. With reference to the expanded views (i) and (ii) of the single solder joint of FIG. 2C, (as in the expanded view of FIG. 1C) the example wiring layers of the PCB are also depicted. For example, wiring layers 232 and 234 run on the top and bottom of the PCB 201, respectively, and wiring layers 236 and 238 run within layers sandwiched inside the PCB. In the expanded view (i) of FIG. 2C, the depicted wires 242 within the top layer 232, and 246 within the middle layer 236, each connects to the pin 216 of the IC 210 via the plating 226 within the through-hole 221/223 and the solder joint 222. In the expanded view (ii) of FIG. 2C, the depicted wires 242 within the top layer 232, 244 within the bottom layer 234, and 246 and 248 respectively within the middle layers 236 and 238, each connects to the pin 216 of the IC 210 via the plating 226 within the through-hole 221/223 and the solder joint 222. As further depicted in FIG. 2C, the PCB section 201 includes an IC 210, a coil 212 and a capacitor 214 inserted into the PCB. Further, the pins or electrical conductor leads of each component (e.g., the pins 216 of the IC 210, the pins 218 of the coil 212, the pins 220 of the capacitor 214) are inserted through the plated holes 221/223 in the PCB, such that there are no pin protrusions extending through the back side of the PCB. When soldered (e.g., through a wave solder process), each of the component leads (216/218/220) and the respective plated through-hole (221/223) form a solder joint 222.

By way of example, the PCB 201 is first manufactured with the appropriate back-drilled through-holes 221/223. Then, using a pin-in-paste process, solder paste is applied to the PCB 201 via a solder paste printing process, and is thereby squeegeed into the through-holes 221/223. According to one example embodiment, the solder paste is applied to the bottom or back side of the PCB. After the solder paste is applied to the PCB, the pin-in-hole (PIH) components are placed through the top or front side of the board, with the component pins or leads being inserting into the respective PCB through-holes 221/223. By way of example, the component leads are pre-cut to a length that protrudes through to the end of the through-holes (just flush with the back side of the PCB), or, alternatively, to a length that is just short of the back side of the PCB. Accordingly, having been run through the solder paste application, with the solder paste being squeegeed or forced into the through-holes, the back-drilled through-holes are filled with solder paste around the component pins. The PCB 201 is then put through a solder reflow oven, which heats the board and melts the solder paste to form a solder joint 222 between each component lead and the metalized portion of the respective through-hole 221/223. In an alternative process, the PCB is put though a solder wave bath process, which heats the board and melts the solder paste to form a solder joint 222 between each component lead and the metalized portion of the respective through-hole 221/223. When heated, the solder or solder paste wicks or draws back from the oversized back-drilled aperture, and flows into the through-hole 221 and fills a space between the component leads and the metalized surface of the through-hole.

Consequently, at the at the back of the PCBA, the component pins are recessed below the back of the PCB plane, and each solder joint is also below the plane, forming a recessed bell shaped solder joint, with a relatively convex bottom, around the component pins. In other words, the resulting solder joint exhibits an "L" shaped cross-section or anchor flange around the inside of the back-drilled portion 223 of the through-hole. Accordingly, this through-hole solder process eliminates any solder protrusions from the back of the assembled circuit card, keeping both the solder and component pins of the solder joint below the back surface of the PCBA. Moreover, such a bell shaped solder joint within the plated through-hole portion 221 and the back-drilled portion 223 of the through-hole (which is non-plated according to the PCBA of the expanded view (i) of FIG. 2C, and plated according to the PCBA of the expanded view (ii) of FIG. 2C), provides a physical anchor at the base of the pin, resulting in a solder joint of significantly improved strength over that of the traditional process. In other words For example, the strength of this solder joint makes it suitable not only for low stress environments, but also for high stress applications that require PCB assemblies that can withstand high G forces.

As such, in accordance with the solder process of example embodiments, the elimination of the resulting pin protrusions and protruding solder joints of prior through-hole solder processes also eliminates the points for potential electrical shorts and for potential damage associated with such protrusions. Additionally, because the resulting solder joints of such example embodiments are below the back surface of the PCBA, the solder joints are protected during handling of the boards throughout the remainder of the product assembly process. For example, the present solder process according to example embodiments eliminates the aforementioned potential shorts and/or damage in assemblies with daughter cards mounted on a further system card or motherboard, and with respect to jumper wires or other components that may be added to the board at a subsequent point. Additionally, the elimination of the protruding solder joints facilitate a reduction of the minimum distance required between two adjacent boards in the overall assembly—thus facilitating reductions in overall product size and other associated benefits. Further, the back-drilled through-hole solder process facilitates the manufacture of a component assembly that eliminates any potential requirement for a second insulating substrate, eliminating the associated labor and cost of cutting the pin protrusions after the solder process as well as that of adding the extra insulating PCB.

Figure 3A:
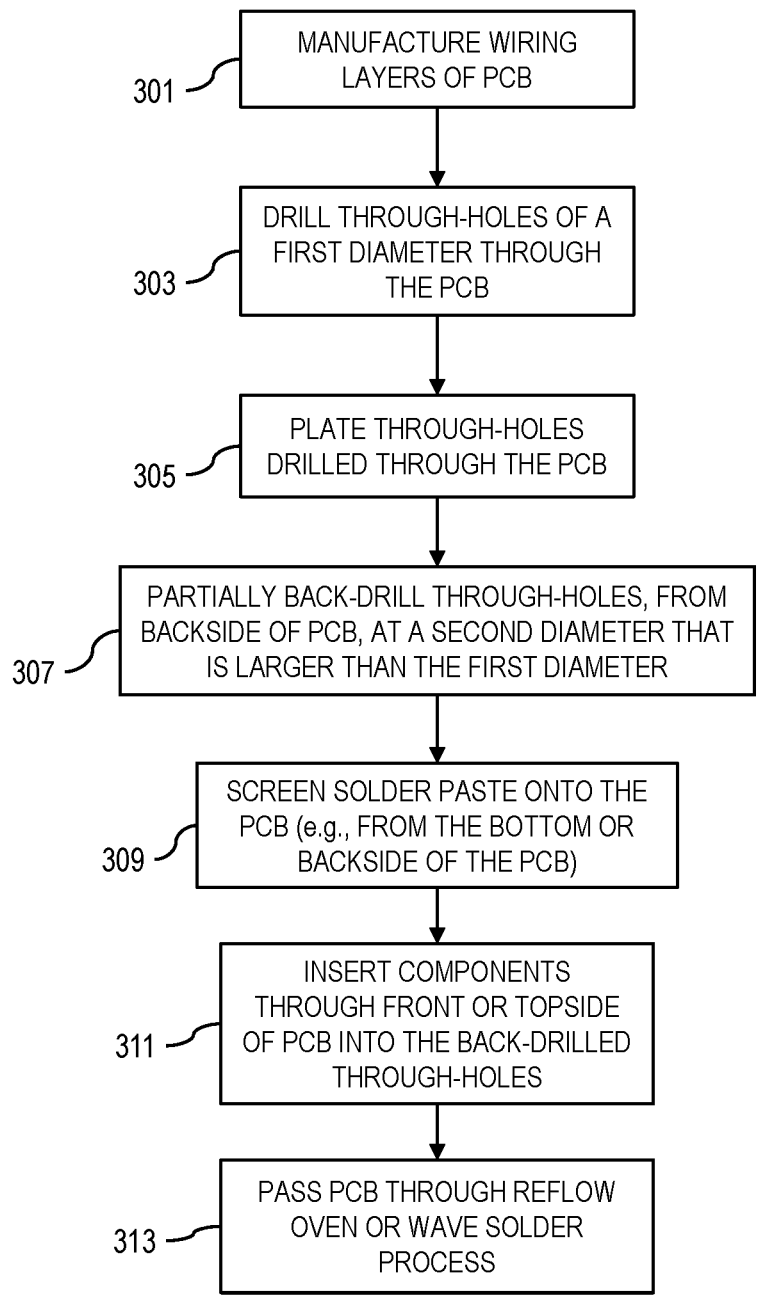
FIG. 3A illustrates a flow chart depicting a process for a through-hole PCB soldering/assembly process, employing back-drilled through-holes, in accordance with an example embodiment of the present invention.

FIG. 3A illustrates a flow chart depicting a process for a through-hole PCB 201 soldering/assembly process, employing back-drilled through-holes 221/223, in accordance with an example embodiment of the present invention. The PCB 201 proceeds through the normal process of fabricating the wiring layers of the PCB (Step 301). The through-holes are drilled at a first diameter (Step 303), and plated (Step 305). Then, once the through-holes are plated, the PCB 201 is put through a further process step, whereby each through-hole is partially back-drilled from the bottom or back side of the PCB at a diameter relatively larger than the diameter of the original through-hole (Step 307). By way of example, the back-drilled portion 223 of the through-hole is drilled approximately 20% of the way though the through-hole (approximately $\frac{1}{5}^{th}$ of the thickness of the PCB) from the bottom or back side of the PCB. By way of further example, the diameter of the back-drilled portion 223 of the through-hole is approximately 200% of the diameter of the through-hole 221 (two times the diameter of the through-hole 221). The back-drilling removes the metal plating from the back-drilled portion 223 of the through-hole, and thereby creates a reservoir for the solder paste.

The solder paste is then screened onto the board, and during that process step the solder paste is squeegeed and forced into the back-drilled portion 223 of the through-hole, and may be at least partially forced into the narrower portion of the through-hole (Step 309). By way of example, the solder paste is screened onto the bottom or back side of the PCB. Further, once the board is removed from the solder paste screening step, the components are inserted into the solder paste filled through-holes from the top or front side of the board (Step 311), and the component pins extend to a point flush with or slightly above (within) the end of the back-drilled portions 223 of the through-holes (slightly above the surface of the back-side of the PCB). For example, during a component preparation process, the component pins are cut to an appropriate length prior to insertion into the PCB. The boards are then passed through the reflow oven and heated in stages to heat the solder paste and melt the solder within the paste (Step 313). As a result of the heating process, the melted solder is wicked up into the narrower portion of the through-hole and adheres to the metal plating in that portion of the hole, and the excess solder remains below, in the wider portion of the through-hole, and acts as an anchor anchoring the solder joint from the bottom of the PCB (without protruding through the PCB).

Figure 3B:
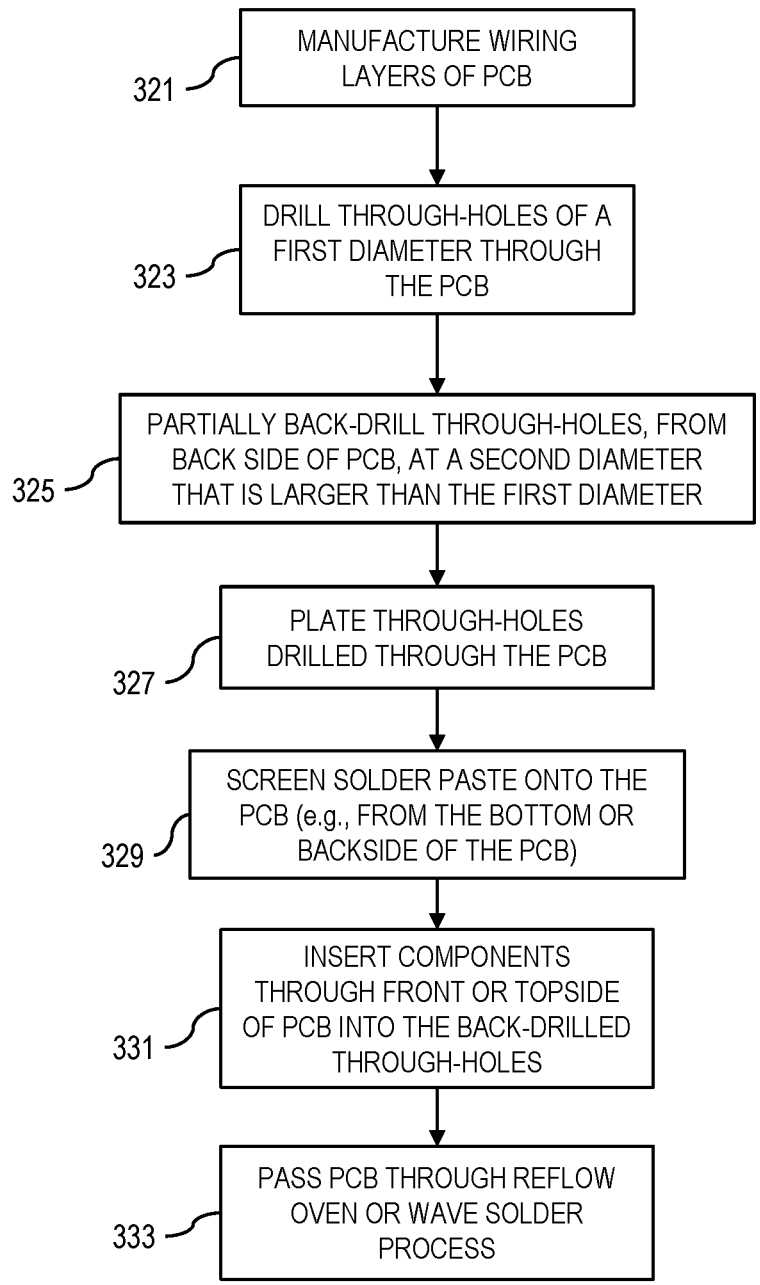
FIG. 3B illustrates a flow chart depicting a process for a through-hole PCB soldering/assembly process, employing back-drilled through-holes, in accordance with another example embodiment of the present invention.

FIG. 3B illustrates a flow chart depicting a process for a through-hole PCB soldering/assembly process, employing back-drilled through-holes, in accordance with a further example embodiment of the present invention. With reference to FIG. 3B, the PCB 201 proceeds through the normal fabrication process of fabricating the wiring layers of the PCB (Step 321). The through-holes are drilled through the PCB at a first diameter (Step 323). In this embodiment, the through-holes are then partially back-drilled (from the bottom or back side of the PCB) at the second diameter relatively larger than the first, prior to the plating of the holes (Step 325). Then, once back-drilled, the back-drilled through-holes 221/223 are plated (Step 327). The solder paste is then screened onto the board, and during that process step the solder paste is forced into the back-drilled portion 223 of the through-hole, and may be at least partially forced into the narrower portion of the through-hole (Step 329). By way of example, the solder paste is screened onto the bottom or back side of the PCB. The components are inserted into the solder paste filled through-holes from the top or front side of the board (Step 331). Here also, the component pins extend to a point flush with or slightly above the end of the back-drilled portions 223 of the through-holes (slightly above the surface of the back-side of the PCB). The boards are then passed through the reflow oven and heated in stages to heat the solder paste and melt the solder within the paste (Step 333). As a result of the heating process, the melted solder is wicked up into the narrower portion of the through-hole and adheres to the metal plating in that portion of the hole, and the excess solder remains below in the wider portion of the through-hole and adheres to the metal plating in that portion of the hole. Again, the portion of the solder joint 222 within the wider portion of the back-drilled through-hole 221/223 acts as an anchor anchoring the solder joint from the bottom of the PCB (without protruding through the PCB). The expanded view of FIG. 2C illustrates the result, where the plating and wire layer connections are through the entire back-drilled through-hole 221/223.

Moreover, in accordance with a further embodiment, surface-mount components may also be placed on surface-mount pads on the top side of the PCB 201 and solder paste can be further screened on the top side for the surface-mount components. Accordingly, the present process according to example embodiments facilitates the mounting of both through-hole components and surface-mount components, through the same manufacturing/assembly process, while eliminating a step for the mounting of the surface-mount components.

The foregoing description of the present invention provides illustration and description, but is not intended to be exhaustive or to limit the invention to the precise one disclosed. Modifications and variations are possible consistent with the above teachings or may be acquired from practice of the invention. Thus, it is noted that the scope of the invention is defined by the claims and their equivalents.

What is claimed is:

1. A through-hole printed circuit board (PCB) system, comprising:
   a PCB having one or more back-drilled through-holes each having a through-hole portion and a back-drilled portion, wherein:
      each back-drilled portion is back-drilled to a depth partially through the PCB at a second diameter that is larger than a first diameter of the through-hole portion;
   one or more components on a top surface of the PCB, wherein:
      one or more pins of each component is inserted into a corresponding back-drilled through-hole of the one or more back-drilled through holes; and
      each of the one or more pins is recessed from a bottom surface of the PCB within the corresponding back-drilled through-hole of the one or more back-drilled through holes; and
   one or more solder joints within each back-drilled through-hole of the one or more back-drilled through-holes that has a pin of the one or more pins inserted, wherein:
      for each of the one or more solder joints, the solder joint partially fills the back-drilled portion of the back-drilled through hole;
      the solder joint does not protrude beyond the bottom surface of the PCB;
      the solder joint is a recessed bell-shaped solder joint such that the solder joint forms a convex shape.

2. The through-hole PCB system of claim 1, wherein the solder joints were formed on the PCB from solder paste applied to the bottom surface of the PCB.

3. The through-hole PCB system of claim 1, wherein the back-drilled portion of each back-drilled through-hole is of a depth of approximately 20% of an overall depth of the back-drilled through-hole.

4. The through-hole PCB system of claim 1, wherein the back-drilled portion of each back-drilled through-hole is of a diameter that is approximately 200% of the diameter of the back-drilled through hole.

5. The through-hole PCB system of claim 1, wherein plating within each back-drilled through-hole does not extend into the back-drilled portion of the back-drilled through-hole.

6. The through-hole PCB system of claim 1, wherein plating within each back-drilled through-hole extends into the back-drilled portion of the back-drilled through-hole.

7. The through-hole PCB system of claim 6, wherein the plating that extends into the back-drilled portion of the back-drilled through-hole is connected with a wire within a layer of the PCB.

8. The through-hole PCB system of claim 1, wherein the one or more pins do not extend beyond a bottom surface of the PCB.

9. A through-hole printed circuit board (PCB), comprising:
   a PCB having a back-drilled through-hole having a through-hole portion and a back-drilled portion, wherein:
      the back-drilled portion is back-drilled to a depth partially through the PCB at a second diameter that is larger than a first diameter of the through-hole portion;
   a pin of a component is inserted into the back-drilled through-hole, wherein the pin is recessed from a bottom surface of the PCB within the back-drilled through-hole; and
   a solder joint within the back-drilled through-hole partially fills the back-drilled portion of the back-drilled through hole; wherein:
      the solder joint does not protrude beyond a bottom surface of the PCB; and
      the solder joint is a recessed bell-shaped solder joint such that the solder joint forms a convex shape.

10. The through-hole PCB of claim 9, wherein the solder joint was formed on the PCB from solder paste applied to the bottom surface of the PCB.

11. The through-hole PCB of claim 9, wherein the back-drilled portion of the back-drilled through-hole is of a depth of approximately 20% of an overall depth of the back-drilled through-hole.

12. The through-hole PCB of claim 9, wherein the back-drilled portion of the back-drilled through-hole is of a diameter that is approximately 200% of the diameter of the back-drilled through hole.

13. The through-hole PCB of claim 9, wherein plating within each back-drilled through-hole does not extend into the back-drilled portion of the back-drilled through-hole.

14. The through-hole PCB of claim 9, wherein plating within each back-drilled through-hole extends into the back-drilled portion of the back-drilled through-hole.

15. The through-hole PCB of claim 14, wherein the plating that extends into the back-drilled portion of the through hole is connected with a wire within a layer of the PCB.

16. The through-hole PCB of claim 9, wherein the pin does not extend beyond a bottom surface of the PCB.

\* \* \* \* \*